METHOD FOR MAKING PRINTED CIRCUIT BOARDS

Filed Dec. 21, 1964

INVENTOR
Hyogo Hirohata
Tsuneshi Nakamura

BY Stevens, Davis, Miller & Mosher
ATTORNEY

United States Patent Office 3,391,455

Patented July 9, 1968

3,391,455
METHOD FOR MAKING PRINTED CIRCUIT BOARDS

Hyogo Hirohata, Neyagawa-shi, and Tsuneshi Nakamura, Moriguchi-shi, Japan, assignors to Matsushita Electric Industrial Co., Ltd., Osaka, Japan, a corporation of Japan Filed Dec. 21, 1964, Ser. No. 419,894
Claims priority, application Japan, Dec. 26, 1963, 38/71,540; Mar. 25, 1964, 39/16,835, Apr. 28, 1964, 39/24,676; Oct. 30, 1964, 39/62,037
5 Claims. (Cl. 29—625)

ABSTRACT OF THE DISCLOSURE

A method for making a printed circuit board comprising applying an adhesive to the surface of an organic resin plate in an electrical circuit pattern, scattering metal powders on said adhesive, pressing the scattered metal powders so that said metal powders are partly embedded in and partly exposed to the surface of said adhesive, curing said adhesive combined with said metal powders and depositing a conductive metal coating on said exposed metal powders by electroless plating whereby said exposed metal powders act as a catalyzer.

This invention relates to a method of providing a metal layer on the surface of electric insulating materials, and more particularly to a method of making printed circuit boards.

A conventional method of making a printed circuit board is to provide a copper film layer on the surface of an electric insulating material, to print with etching resist on the copper layer the requisite form of electric circuit, and then to dissolve away the portions of copper layer that have no etching resist painted thereon by etching, the etching resist being removed thereafter.

The present invention is different from such a known method, in that electroconductive elements are formed on only those portions of an insulating plate that are required for the circuit. Consequently, the invention provides simple manufacturing steps assuring the various characteristics required of a printed circuit board. According to the present invention, metal powders are scattered onto the surface of an insulating plate which has been preliminarily printed or painted with an adhesive in the desired form of electric circuit. A suitable pressure is applied on the metal powders to have the metal powders adhered to the adhesive layer, and then metal is deposited on the metal powders by means of a chemical reduction process reaction (i.e., electroless plating) whereby strong metal layers having a good solder ability are formed on the insulating plate.

A similar method is known, in which metal powders are scattered onto the surface of an insulating base plate, on which an adhesive has preliminarily been painted over the whole area, and then metal powders are applied thereto under pressure with use of a die in the form of the electric circuit, whereby metal powders are cold welded onto the base plate to form the conductors. The conductors in such a printed circuit board are layers of metal powders that have formed together by the pressure applied thereto. According to the present invention, the metal powders adhere to the surfaces of adhesive layers and facilitate the subsequent chemical deposition of metal layers in the form of an electric circuit while assuring strong adhesion of the metal layers to the base plate. It is, therefore, to be noted that the metal powder layers have poor electric conductivity which is to be improved by the chemically deposited metal layers, according to the present invention.

Another known method, which is somewhat similar to the present invention, paints or prints a mixture of metal powders and an adhesive on the surface of an insulating base plate in the form of the desired electric circuit. In such a printed circuit, ample conductivity of the circuit is hard to obtain, and in addition, soldering of other circuit components to the printed circuit is difficult to effect. Metal material may be plated on the printed circuit of the mixture of metal powders and adhesive for obtaining good conductivity, but it is very difficult to have metal powders exposed on the surfaces of layers of the mixed material sufficiently to effect the metal plating, which can be accomplished only after the surfaces have been abraded mechanically. Such a method is, therefore, of poor practicality. Metal may alternatively be electrically plated or chemically plated by a displacement reaction on metal powder layers secured to the insulating base plate by an adhesive. But the printed circuit board, in general, includes many individual electric circuits formed on a base plate, and consequently, electrical plating becomes a very complicated process and is not suitable for mass production. Chemical plating by a displacement reaction can achieve plating, such as silver plating on copper powders and copper plating on iron powders. However, a chemical plating by a displacement reaction is, in general, extremely difficult to regulate so that the deposited metal is apt to become coarse particles resulting in weak metal layers. Further, in such a reaction the desired metal deposits while the base metal is partly dissolved naturally. The deposited metal is prevented from intimately uniting with the base metal. In addition, after the base metal has been covered by the deposited metal, a displacement reaction cannot take place, and consequently, the layer of deposited metal cannot be of ample thickness to serve as a conductive layer, in general. Thus, the printed circuit board made by this method has a poor adhering strength between the conductive layers and the base plate, and insufficient mechanical strength of the conductive layers themselves, so that the conductive layers are apt to be damaged by soldering, etc. Thus, such a printed circuit board cannot be said to be of good reliability. In these methods, as above-described, since deposited metal particles are coarse, in general, strong metal film layers cannot be formed. Thus, such printed circuit boards are poor in mechanical strength, and liable to have the plated metal layers broken or damaged by soldering thereto other circuit elements, resulting in very poor reliability in connection thereto of other circuit elements.

The present invention relates to improvements for overcoming the above-mentioned various disadvantages of known methods for making printed circuit boards, and comprises steps of painting or printing an adhesive on an electrically insulating base plate in the form of the desired electrical circuit, scattering thereon metal powders capable of serving as a catalyzer for subsequent electroless plating, adhering the metal powders to the layer of adhesive by means of suitable pressure applied thereto, if necessary, removing the metal powders not adhering to the layer of adhesive curing the adhesive, by heating, etc., if necessary, and depositing thereon metal by means of electroless plating. According to the invention, the metal powders are partly embedded in the adhesive layer, so that the metal powders are secured to the base plate by the adhesive, and at the same time, the metal powders are partly exposed on the surface of adhesive layer to serve as a catalyzer for the subsequent electroless plating. Metal deposited on the surface of the metal powder layer by the electroless plating forms an extremely dense layer without fear of dissolving the base metal powders, and grows while the metal powders are serving as cores, and then bonds together the metal powders with an increase in thickness to gradually form a dense metal film layer. As a result, an insulating base plate having metal film layers bonded thereto by use of adhesive, is obtained practically. The metal film layers having many extremely convex and concave portions and consequently mechanical hang produce a strong bonding between conductive layers and the base plate provide great mechanical strength of the conductive layers themselves, superior soldering ability, etc. Thus, in addition to improved electrical characteristics, the printed circuit board according to the present invention is satisfactory in mechanical strength, soldering workability for securing thereto other electrical parts, etc.

The method for accomplishing the foregoing objects and other advantages, which will be apparent to those skilled in the art, are set forth in the following specification and claims and are illustrated in the accompanying drawings dealing with several embodiments of the present invention. Reference is made now to the drawings in which:

Figure 1:
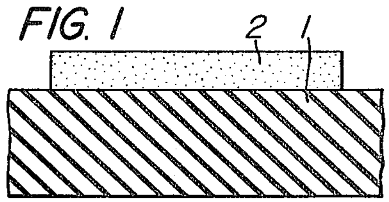
FIG. 1 shows a cross-sectional view of an insulating base plate printed with an adhesive in a desired electrical circuit pattern.

Referring to FIG. 1, the electrical insulating base plate 1 employed in the present invention may be any one of the various kinds of synthetic resin plates, synthetic resin laminated plates, etc., having the necessary electrical and mechanical properties, chemical resistance, heat resistance, etc. The most popular base plate is laminated plate of phenol resin. An adhesive 2 is painted on the base plate 1 in the form of the desired electrical circuit by any of the various painting methods, but it is desirable to prepare an ink in which suitable printing adaptability is imported to the adhesive, and apply the ink to the base plate by a silk screen printing process. The adhesive may be epoxy resin, phenol resin, and the like, capable of having suitable printing adaptability, chemical resistance, heat resistance, etc.

Figure 2:
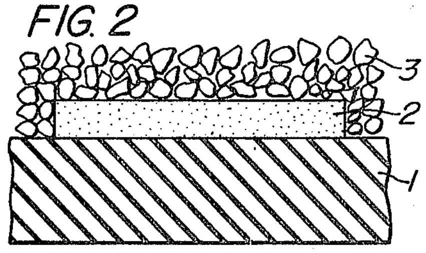
FIG. 2 shows a cross-sectional view of the printed insulating base on which metal powders are scattered.

Referring to FIG. 2, metal powders 3 are scattered onto the surface of base plate 1 having the adhesive 2 painted thereon in the form of the desired electrical circuit. The metal powders should have such nature that they can serve as a catalyzer in the subsequent electroless plating and may be selected from the group consisting of powdered silver, copper, iron, nickel, cobalt, gold, platinum, palladium, their alloys, and powders plated with such metals. The powders should preferably have a dendrite shape in general. The particle size used is in the range of 10 to 100$\mu$. In scattering the metal powders, they are preferably scattered to a thickness as even as possible. After the metal powders have been thus scattered, a suitable pressure is applied to the scattered powders to such a degree that the adhesive layer is not deformed while sufficiently securing the powders to the adhesive layer. A press may be used for application of the pressure, or a pair of rubber rollers may be employed for passing therebetween the assembly shown in FIG. 3.

Figure 3A:
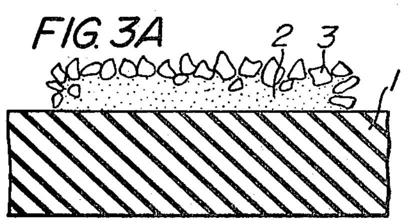
FIG. 3A is a cross-sectional view of the printed insulating base having the scattered metal powders adhered to the adhesive.
Figure 3B:
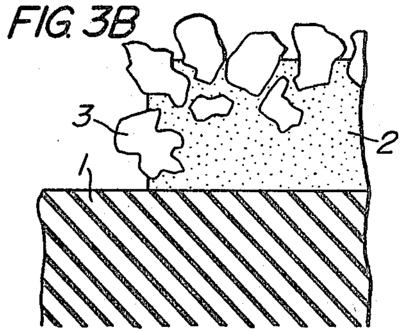
FIG. 3B is an enlarged partial cross-sectional view of FIG. 3A, in which the scattered metal powders are partly embedded in and partly exposed to the surface of the adhesive according to the invention.

After pressing, metal powders not adhering to the adhesive layer 2 are removed, and the adhesive layer is cured or hardened to secure the metal powders to the surface of the base plate, as shown by 3 in FIGS. 3A and 3B. The removed metal powders may be recovered for re-use. By suitably selecting the thickness of the painted or printed layer of adhesive the shape and size of metal powders, and the conditions of application of pressure, the metal powders can be secured to the adhesive layer in intimate adhesion therewith, with individual metal powders partly embedded into the adhesive layer and partly exposed beyond the surface of adhesive layer. Thus, the metal powders are strongly fixed on the base plate by the adhesive and at the same time, enable the deposition of metal by means of the subsequent electroless plating yet to be described.

According to the present invention, copper, nickel, or other metal is deposited by electroless plating on the metal powders fixed to the surface of insulating base plate, as described, above, and the invention will be explained below taking copper as an example of the deposited metal.

Figure 4:
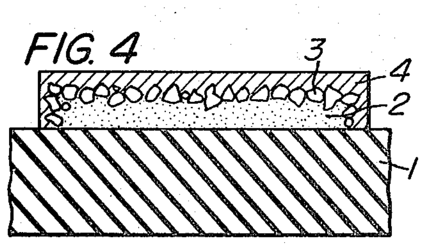
FIG. 4 is a cross-sectional view of the printed insulating base which is obtained by depositing a metal conductive layer on the base of FIG. 3A.

An insulating base plate having metal powders fixed thereto is immersed into an alkali solution of a complex salt of copper containing formaldehyde added thereto as reducing agent. Copper ions in the solution are reduced by the formaldehyde to deposit metallic copper, and since the metal powders, such as silver, copper, etc., fixed to the insulating base plate serve as a catalyzer in the above reaction, the copper deposition onto the metal powders is accelerated. Consequently, if appropriate conditions of the reaction are selected, it is possible to have copper 4 deposited onto the metal powders 3 only, as shown in FIG. 4. Alternatively, nickel may be deposited in place of copper. In this case a nickel salt solution containing sodium hypophosphite as reducing agent is used, into which is immersed the base plate having a metal powder layer fixed thereto in the form of the desired electric circuit. As the metal powder layer in this case, powders of nickel or iron are preferable.

One important feature of the present invention is to have a predetermined metal deposited by means of electroless plating onto metal particles fixed on an insulating base plate. But the invention is not limited to particular conditions, such as the formation of the solution, conditions of reaction, etc., for improving various characteristics, such as deposition rate of metal, stability of plating solution, etc.

The metal deposited as described above forms an extremely dense layer, and is bonded strongly with the base metal powders fixed to the insulating base plate, and in addition, such metal powders are strongly bonded together by the deposited metal layer. As a result, a great mechanical strength is assured, and soldering of external parts or elements to the metal layer can be effected with ease and safety, just as in the case of ordinary metal foil fixed to the base plate. Since the layer of metal deposited by electroless plating is fixed to the insulating base plate through metal particles partly embedded into the layer of adhesive, the deposited metal is very strongly bonded to the base plate.

*Example 1*

To 30 g. of epoxy resin consisting of 20 g. of Achmex R–11 and 10 g. of Achmex H–85 was added 3 g. of carbon to obtain an adhesive. On a insulating base plate of phenol resin laminate was printed in the desired form of electrical circuit with the above adhesive by the silk-screen printing process. Copper powders of 10 to 100$\mu$ particle size were then scattered onto the layer of the adhesive to form a thickness of 1 to 2 mm., and a pressure of 0.5–1.0 t./cm.$^2$ was applied thereon to have copper particles secured to the adhesive. Then the copper particles not secured to the adhesive were removed, and the adhesive was cured by heating at 150±10° C. for about one hour. After preliminary treatments, such as water rinsing, acid rinsing, etc., the plate was immersed into a solution of the following composition at 25°–35° C., for depositing copper onto the above-mentioned copper particles:

| | | |
|---|---|---|
| Copper nitrate | g.. | 8.0 |
| Potash soda tartrate | g.. | 15.0 |
| Caustic soda | g.. | 10.0 |
| Formaldehyde (36%) | ml.. | 40 |

The above constituents were dissolved into an amount of water necessary for forming 1 l. of the solution as a whole.

After a predetermined amount of copper had been deposited by electroless plating, the plate was taken out of the solution, washed with water, and polished to complete the printed circuit board.

*Example 2*

A desired form of an electric circuit was printed on a phenol-resin laminated plate with an adhesive consisting of phenol resin, benzyl alcohol, and carbon by the silk-screen printing process, and iron particles of about 10 to 100$\mu$ size were scattered thereon to a thickness of 1–2 mm. After application of pressure of 0.5–1.0 t./cm.$^2$, iron particles not adhering to the adhesive layer were swept away, and the adhesive was cured by heating at 150°±10° C. for about one hour. After preliminary treatments, such as water washing, acid washing, etc., the plate was immersed into a solution of the following composition at 80°–100° C.:

| | G. |
|---|---|
| Nickel chloride | 30 |
| Sodium hypophosphite | 10 |
| Sodium citrate | 15 |

Water to form 1 l. of solution as a whole.

After a predetermined amount of nickel had been deposited, the plate was taken out of the solution, and washed and polished.

Several modifications of the basic process of the present invention described above will now be explained.

In order to strengthen the joint of a lead wire soldered to the printed circuit through a hole in the base plate, a metal layer is formed continuously from the conductor on the surface of the insulating base plate to a portion of a hole for the insertion of parts extending through the base plate, for enabling solder material to enter into the hole, thus assuring strong solder jointing and also reinforcing the attachment of external part to the printed circuit plate.

Figure 5:
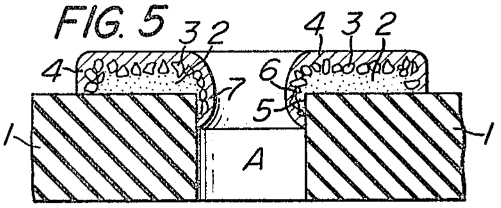
FIG. 5 is a cross-sectional view of a printed circuit board in which a hole is partly covered with metal conductive layer.

Referring to FIG. 5, a hole A, for insertion of parts, is formed through the insulating base plate 1 having requisite electrical characteristics as well as mechanical strength, by drilling or by punching, the latter being preferable, as the hole formed thereby has somewhat rounded hole edges which are advantageous for the subsequent step. Next, a layer of adhesive 2 is formed in the form of a desired electrical circuit on the base plate 1 in the manner described above, the base plate having holes A for lead wire insertion formed at predetermined positions in the electrical circuit. At this time, the adhesive is applied to the surface of base plate 1 and also to a portion of the inner wall surface of holes A for lead-wire insertion as shown by reference number 5. Then, metal powders are scattered onto the adhesive layers 2 and 5, so that the metal powders can serve as a catalyzer in the subsequent electroless plating for the deposition of conductive metal, and mechanical pressure is applied to the metal powders to have the metal powder layers 3 and 6 positively secured to the adhesive layers 2 and 5, respectively. The adhesive layers are then cured to fix the metal powders to the base plate. Subsequently, conductive metal layers 4 and 7 are formed on metal powder layers 3 and 6 by the electroless plating. Since the metal layers 7 thus formed partly in holes A are a continuation of the circuit layer 4, lead wires which have been inserted into the holes A can be soldered to the layer 4 as well as layers 7 and are afforded with an increased soldering strength.

Figure 6:
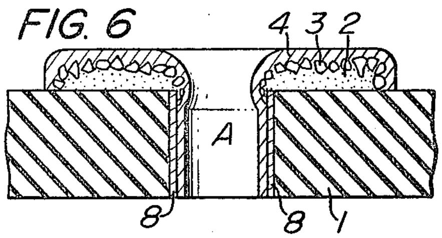
FIG. 6 is a cross-sectional view of a printed circuit board in which a hole is coated with the metal conductive layer over the entire surface thereof.

A conductive layer may be formed on the whole inner wall surface of hole A, as shown in FIGS. 6 to 9, in order to provide increased reliability for positive soldering of the lead wire. This is particularly advantageous when printed electrical circuits are formed on opposite surfaces of the base plate 1 and are electrically connected to each other through the conductive layers on the walls of the holes in the plates. In the example shown in FIG. 6, the insulating base plate 1 has its smooth surfaces. In this example, after provision of holes A, one of which is shown in FIG. 6, an activating treatment is effected for facilitating metal deposition by the subsequent electroless plating. Various activating treatments may be employed, but in this example, the base plate 1 was immersed into a stannous chloride solution and a palladium chloride solution, successively. This activating treatment is effected for the base plate 1 as a whole, but since the base plate has extremely smooth surfaces, the activity imparted by the treatment to the surfaces of base plate 1 can readily be deprived by subsequent water washing and brushing or the like, and the inner wall surface of hole A only preserves the activated layer 8. An adhesive layer 2 is then formed on the surface of base plate 1 in the desired form of the electric circuit, which makes it possible for the hole A to be positioned at a predetermined point in the layer 2. Catalytic metal powders, for example, copper powders, are scattered onto the adhesive layer 2 and pressed to form metal powder layer 3. The subsequent electroless plating for deposition of conductive metal layer is effected, in this example, by immersing the plate into a liquid mixture of an alkali solution of copper complex salt and formaldehyde. As a result, copper is deposited on the copper powder layer 3, which serves as a catalyzer, and on the activated layer. Thus, a conductive metal layer 4 is formed simultaneously on both copper powders on the base plate and hole surface.

Figure 7:
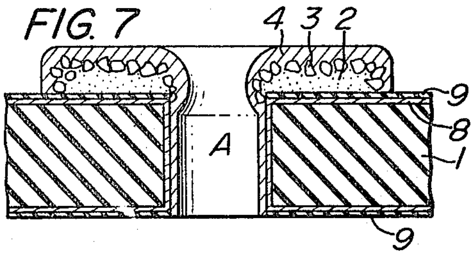
FIG. 7 is a cross-sectional view of a printed circuit board, as another embodiment of the invention, having a hole coated entirely with the metal conductive layer.

In the example shown in FIG. 7, the surfaces of base plate 1 are not smooth and preserve the activated layer 8 formed by the above-described activating treatment, even after water washing and rinsing. In this case, the surfaces of base plate 1 are painted with an insulating paint 9 so that only the activated layer 8 in the hole A is exposed. Then, adhesive 2 is applied to the insulating layer 9 in the desired form of the electric circuit, and then catalytic metal powders are scattered on the adhesive layer 2 and pressed to form metal powder layer 3. After curing of the adhesive layer, the plate is immersed into a liquid mixture of a metal salt solution and a reducing agent to effect the electroless plating for depositing conductive metal layer 4 on the metal powder layer 3 as well as on the activated layer 8 in the hole A.

Figure 9:
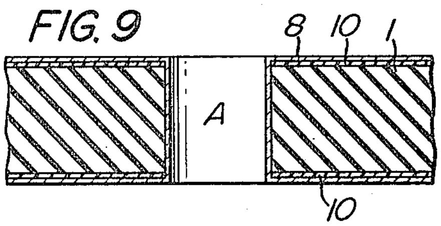
FIG. 9 is a cross-sectional view of an insulating base which is coated with an insulating paint and is treated with an activating process after being holed so as to form the printed circuit board of FIG. 8.
Figure 8:
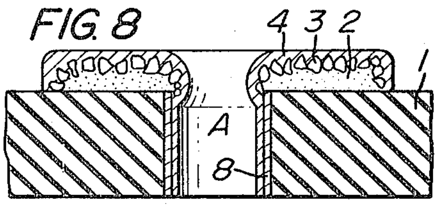
FIG. 8 is a cross-sectional view of a printed circuit board, as a further embodiment of the invention, having a hole coated entirely with the metal conductive layer.

In the example shown in FIG. 9, the insulating base plate 1 also has rough surfaces which cannot be sufficiently smooth. In this example, a soluble paint 10 is first applied to the surfaces of base plate 1, and then hole A for lead wire insertion, is formed therein. Thereafter, activated layers 8 are formed by the aforementioned activating treatment, on the surfaces of base plate 1 and on the inner surfaces of hole A. Then, if the soluble paint layers 10 are removed, the activated layers 8 on the surfaces of base plate 1 are also removed together with layers 10, but the activated layers 8 on the wall are left, as shown in FIG. 8. The next step is to apply adhesive layer 2 to the base plate 1 in the form of an electrical circuit, then to form the catalytic metal powder layer 3. After the adhesive layer 2 has been cured, the plate is immersed into a liquid mixture of a metal salt solution and a reducing agent, for depositing conductive metal layer 4 simultaneously on the metal powder layer 3 as well as on the activated layer 8.

As has been clearly understood from the foregoing description, a conductive metal layer is formed on the inner surfaces of hole A for insertion of parts and on the surface of copper powder, in the desired form of an electric circuit on the base plate, simultaneously. Therefore, the manufacturing process can be simply and easily effected. In addition, soldering of lead wires of parts can be effected, with solder material entering entirely into the hole A, and the reliability of the solder joints are remarkably increased. Further, when electrical circuits are printed on the opposite surfaces of the base plate, the electrical circuits on both surfaces may be connected together through the conductive metal layer on the inner surface of hole A.

What we claim is:

1. A method for making a printed circuit board comprising the steps of forming a plurality of holes in an organic resin plate, activating the inner wall surface of said holes, by dipping the holed organic resin plate into a solution comprising an activating agent, applying an adhesive in an electrical circuit pattern to at least one side of the organic resin plate, said holes being at least partly coated with said adhesive during application thereof, scattering metal powders on said adhesive, said metal powders consisting of at least one element selected from the group consisting of copper, iron, cobalt, aluminum, nickel, silver, gold, beryllium, platinum, palladium, rhodium, their alloys, and particles having such a metal plated thereon, pressing the scattered metal powders so that said metal powders are partly embedded in and partly exposed on the surface of said adhesive, curing said adhesive combined with said metal powders and depositing a conductive metal coating on said exposed metal powders and on said activated surface by electroless plating.

2. A method for making a printed circuit board as defined in claim 1 wherein said conductive metal coating is made of copper.

3. A method for making a printed circuit board as defined in claim 1 wherein said conductive metal coating is made of nickel.

4. A method for making a printed circuit board as defined in claim 1 wherein said activating agent is removed from both sides of said holed organic resin plate upon the removal of the latter from said solution.

5. A method for making a printed circuit board as defined in claim 1 wherein both sides of said dipped organic resin plate are coated with an insulating paint.

References Cited

UNITED STATES PATENTS

| | | | |
|---|---|---|---|
| 3,132,204 | 5/1964 | Giellerup | 117—212 X |
| 3,269,861 | 8/1966 | Schneble | 117—217 X |
| 2,936,814 | 5/1960 | Yakubik. | |
| 3,259,559 | 7/1966 | Schneble et al. | |
| 3,146,125 | 8/1964 | Schneble | 117—112 |
| 3,060,062 | 10/1962 | Katz | 112—212 |
| 3,031,344 | 4/1962 | Sher. | |
| 2,947,064 | 8/1960 | Langton | 29—155.5 |
| 2,897,409 | 7/1959 | Gitto. | |
| 2,848,359 | 8/1958 | Talmey | 117—212 |

OTHER REFERENCES

Nat'l Bureau of Standards Circular, Printed Circular Techniques, Nov. 15, 1947, pp. 28 and 29.

CHARLIE T. MOON, *Primary Examiner.*

J. CLINE, *Assistant Examiner.*

UNITED STATES PATENT OFFICE

CERTIFICATE OF CORRECTION

Patent No. 3,391,455 July 9, 1968

Hyogo Hirohata et al.

It is certified that error appears in the above identified patent and that said Letters Patent are hereby corrected as shown below:

In the heading to the printed specification, line 11, "39/62,037" should read -- 39/62,031 --.

Signed and sealed this 16th day of December 1969.

(SEAL)
Attest:

Edward M. Fletcher, Jr.
Attesting Officer

WILLIAM E. SCHUYLER, JR.
Commissioner of Patents